United States Patent [19]

Favin

[11] 4,438,504
[45] Mar. 20, 1984

[54] ADAPTIVE TECHNIQUES FOR AUTOMATIC FREQUENCY DETERMINATION AND MEASUREMENT

[75] Inventor: David L. Favin, Little Silver, N.J.

[73] Assignee: Bell Telephone Laboratories, Incorporated, Murray Hill, N.J.

[21] Appl. No.: 273,612

[22] Filed: Jun. 15, 1981

[51] Int. Cl.³ .............................................. G06F 15/34
[52] U.S. Cl. .................................. 364/724; 364/484; 328/138
[58] Field of Search .................... 364/484, 485, 724; 328/138, 167; 179/1 D; 324/78 D, 78 F

[56] References Cited

U.S. PATENT DOCUMENTS

| | | | |
|---|---|---|---|
| 4,021,653 | 5/1977 | Sharp et al. | 364/484 |
| 4,034,196 | 7/1977 | Butterweck et al. | 364/724 |
| 4,213,187 | 7/1980 | Lawrence et al. | 364/724 |
| 4,236,224 | 11/1980 | Chang | 364/724 |
| 4,245,325 | 1/1981 | Kikuchi et al. | 364/724 |
| 4,277,650 | 7/1981 | Arend et al. | 179/84 VF |
| 4,351,032 | 9/1982 | Challen | 364/724 |
| 4,356,558 | 10/1982 | Owen et al. | 364/724 |

OTHER PUBLICATIONS

"Digital MF Receiver Using Discrete Fourier Transform", by Koval et al., Published in IEEE Transactions on Communications, vol. COM-21, No. 12, Dec. 1973, pp. 1331–1335.

Primary Examiner—Gary Chin
Attorney, Agent, or Firm—John Francis Moran

[57] ABSTRACT

Various implementations of a technique are presented for capitalizing on signal correlation in a manner for providing usable frequency information. In a specific embodiment, a filter (51) is adapted to a signal component of an input signal using a variable generated by an adapter (58). The variable has a prescribed relationship to the frequency of the signal component. The variable is used to weight a combination of signal values derived from past signal history to form a prediction of a future signal. An adder (56) combines the new signal value with the prediction to form an error signal which is used by the filter (51) and the adapter (58). When the filter converges, a frequency indicator (59) using the variable provides an output signal indicative of the frequency of the signal component.

3 Claims, 10 Drawing Figures

ADAPTIVE FILTER

ADAPTIVE TECHNIQUES FOR AUTOMATIC FREQUENCY DETERMINATION AND MEASUREMENT

CROSS-REFERENCE TO RELATED PATENT

U.S. Pat. No. 4,403,298 issued to C. J. May, Jr. on Sept. 6, 1983 and filed on even date herewith is directed to related subject matter concerning the basic inventive arrangement and method illustratively implemented using various techniques and circuitry.

BACKGROUND OF THE INVENTION

This invention relates to the determination of selected characteristics of signals and, more particularly, to an adaptive technique for determining a characteristic, such as frequency, of a digitally encoded version of a signal.

Of the various techniques for conveying information via electrical signals, some type of frequency control whether as a variable or a parameter is probably the most often used. In telecommunications, for example, tones of preassigned frequencies are used for multifrequency (MF) signaling, TOUCH-TONE dialing, numerous test functions, and also data transmission. Both analog filters and digital filters of numerous types have been devised for these purposes. However, the cost and complexity of available arrangements have left something to be desired given the number and variety of applications in the telecommunications industry alone. A further consideration is the presence of quantities of noise in various forms that accompany the signals in a transmission environment.

Heretofore applications of digital filtering techniques have evolved, by and large, as direct replacements of analog arrangements or by using a transformation process, such as the discrete Fourier transform (DFT) or the fast Fourier transform (FFT). The direct replacement process is an utter disregard of the inherent advantages of digital filtering processes. The transformation process, although theoretically appealing, is expensive since it generally requires complex and dedicated hardware to provide the speed necessary for real time applications.

Recent efforts utilized to provide the bandwidth saving of transmission media, such as digital speech interpolation systems, for example, place further demands on the rapid and accurate classification of digital signals into speech, data, or tones each with as many other details as are appropriate for the purpose of the classification. The determination of frequency or frequencies of a signal is an important branch of the signal classification tree. It would be highly desirable to have a fundamental and versatile approach for these sundry applications suitable for implementation in the familiar forms of the finite impulse response (FIR) and the infinite impulse response (IIR) filter.

In a particular application, the arrangement and method should proceed when a satisfactory determination is made of signal presence. Then, the process of adapting should proceed in an orderly controlled fashion using prescribed relationships between the input signal and signals being developed. The process should also be stopped when a loss of signal occurs. The process should, furthermore, take into account a number of possible occurrences before reliable frequency measurements are obtained.

An object of the invention is to provide a flexible and direct technique for frequency determination suitable for low cost implementation.

A related object of the invention is to provide digital filter implementations of high computational efficiency wherein a minimum number of multipliers are required for hardware implementations and wherein reduced calculation time is achieved for software implementations.

An object of the invention is to provide a procedural method of practicing the inventive principles taking into account the numerous situations which may prevent reliable convergence and precise frequency determination.

Another object is to provide a frequency determination procedure capable of performing reliably in the presence of interfering tones and noise.

SUMMARY OF THE INVENTION

An adaptive technique includes an arrangement and method capable of determining the frequency of a signal component present in digitally encoded samples of an input signal. The technique uses an adaptively weighted combination of derived values from at least two samples of the input signal to predict a new signal value. The difference between the predicted value and the actual value defines an error. A variable related to the frequency present is developed using the error and the sign of one of the derived values. This variable serves as the coefficient used to weight the derived values in forming the prediction of the new value. When the adaption converges to the frequency of the signal component, the arrangement serves as a notch filter and the variable may be used to indicate the frequency.

In some of the additional aspects of the invention, the process of adapting proceeds when the input signal magnitude satisfies a prescribed threshold. The number of times the variable is initially adjusted is counted to a prescribed value and the size of the adjustments is then decreased using a prescribed relationship between selected signals. The variable itself is tested by comparing it with a prescribed value for returning the process back to an earlier step for further adjustment. The variable is also compared to another prescribed value for outputting an indication of frequency within a predetermined frequency range. This procedure amounts to comparing the measured frequency through the converged variable value to frequency tolerances also represented in terms of the variable to determine that a measured frequency lies in an acceptable frequency range.

BRIEF DESCRIPTION OF THE DRAWING

A more complete understanding of the invention and the various additional features, additional objects and advantages thereof may be more readily appreciated and better understood by reference to the following detailed description in conjunction with the drawing.

DETAILED DESCRIPTION

Figure 1:
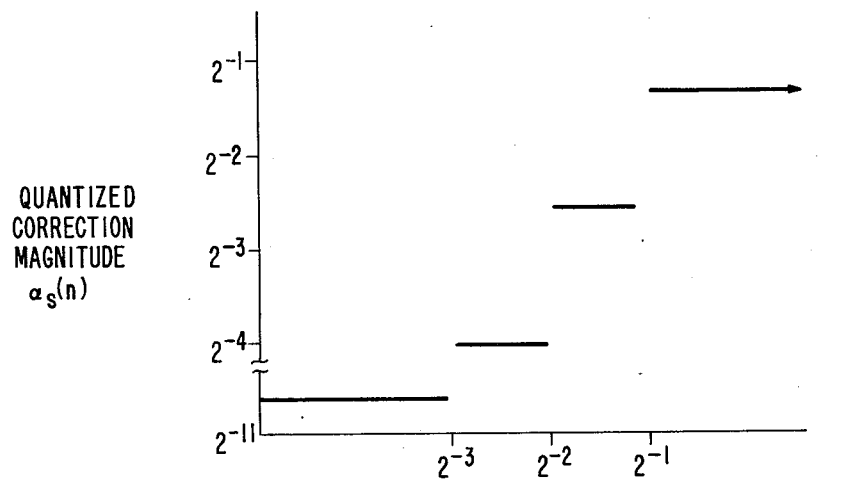
FIG. 1 is a map of correction magnitude with respect to relative error magnitude prediction to the magnitude of the input signal.

Before the inventive aspects of the illustrative embodiments are discussed in detail, a theoretical background concerning the underlying analytic characteristics of sinusoidal signals will be presented.

The data produced by the periodic sampling of pure sinusoids is highly correlated. Such a signal may be expressed as:

$$y(nT) \equiv y(n) = A \sin(\omega_0 nT + \theta) + \gamma(n); \quad \theta \leq \omega_0 < \pi/T \quad (1)$$

where A, T and $\theta$ are arbitrary, but fixed, and $\gamma(n)$ is the uncorrelated (noise) component of y(n) (including encoding noise). If it is assumed that $\gamma(n)$ is zero for the moment, a representation of a sampled sine wave is given by the unique minimum (second) order difference equation for y(n) which is $$y(n) = 2By(n-1) - y(n-2), \quad (2a)$$

where $$B = \cos(\omega_0 T). \quad (2b)$$

$\omega_0 = 2\pi$(input frequency)
T = Time intervals between samples
y(n) = $n^{th}$ sample of the sine wave.

It should be noted that B, the measure of input frequency, is bounded and single valued over the allowed range of $\omega$. In particular, $$B = \frac{y(n) + y(n-2)}{2y(n-1)}; \quad y(n-1) \neq 0. \quad (3)$$

If one ignores noise, finite precision and the possibility that y(n−1) is zero, then B may be determined with a single computation.

Unfortunately, noise, finite precision, and other considerations must be contended with while still obtaining a usable estimate of B. If B is an estimate of B, this may be expressed by $$B = B + \mathrm{ERROR}(B) = \cos(\omega T) \quad (4)$$

where $\omega$ is the frequency estimate of $\omega_0$. Using B to generate an estimate, y(n), of y(n), then $$y(n) = 2By(n-1) - y(n-2). \quad (5)$$

In the adaptive technique the premise used is that given the two preceding samples y(n−1) and y(n−2) then the next sample may be estimated y by using Equation (2a) with an assumed value of $B = \cos(\omega T)$ wherein again $\omega$ is the frequency estimate of $\omega_0$ as in Equation (5). Then an error signal, $\epsilon(n)$, may be defined as the difference between the actual incoming sample as defined by Equation (3) and the estimate given by Equation (5) that is $$\epsilon(n) = y(n) - y(n) = -2\mathrm{ERROR}(B)y(n-1). \quad (6)$$

Equation (6) may be arranged to define the ERROR(B) and again, under ideal conditions, a single correction to B can reduce ERROR(B) to zero. In an actual application with noisy input signals and finite precision the same computation gives an estimate of ERROR(B). This noisy estimate is still adequate to converge B if the corrections are applied judiciously. In general, the correction to B becomes $$C_B = \alpha(-\mathrm{ERROR}(B)); \quad \alpha < 1. \quad (7)$$

In light of the various known techniques of converging algorithms to minimize some measure of the error in B, an approach will be used that provides an implementation of significantly reduced complexity over more fundamental approaches.

As an example of a fundamental convergence algorithm, the product of $\epsilon(n)$ and the sign of the signal defined by the partial of y with respect to B should be considered. Then corrections to B take the form $$C_B(n) = \alpha_H \epsilon(n) \, \mathrm{SIGN}(\delta y / \delta_B); \quad (8)$$

where $\delta y / \delta_B$ also defines a signal "in phase" with $\epsilon(n)$. After each input sample or code group, the corrected B is $$B(n) = B(n-1) + C_B(n). \quad (9)$$

The expected value of the correction for the minimum order estimator and zero mean noise is $$C_B(n) = 2 \, \mathrm{ERROR}(B) \, y(n-1) = \frac{4}{\pi} A(B - B)\alpha_H. \quad (10)$$

With $\alpha_H$ equal to $$\frac{2^{-k}}{\frac{4}{\pi} A}$$

the expected value of the corrected B is $$B(n) = B(n+1) + 2^{-k}(B - B(n-1)) \quad (11)$$

In this form it is recognized that equation (11) is the digital Exponentially Mapped Past, EMP, of B(n). EMP averaging is particularly useful in control or detection situations where interest is directed at the recent past of a process and is described in detail, for example in the *IRE Transactions on Automatic Control*, Vol. AC-5 (January 1960), pages 11-17. From Equation (11), B(n) will approach B exponentially (without bias) with the time constant of $$\tau = \frac{-T}{\ln(1 - 2^{-k})} \approx 2^k T. \quad (12)$$

As $\alpha_H$ is decreased, (k is increased), corrections are effectively averaged over more samples; convergence is slower and the noise on the converged B is reduced. The rate of convergence is controlled by k. With small k the convergence is relatively fast, but the final value is relatively noisy. Normalizing $a_H$ with respect to the input signal level keeps the rate of convergence independent of input level.

Direct implementation of the above convergence algorithm requires multiplication and division which greatly increases hardware complexity. Neither operation is required in the simpler algorithms to be defined hereinafter.

A correction algorithm can be as simple as: $C_B$ equals a single fixed correction magnitude with an appropriate sign. The magnitude of such a correction is bounded by the required accuracy in B. A high accuracy requirement and large initial error would lead to long convergence times. If speed is required we need to make large corrections, at least initially. If high accuracy is required the final convergence must use very small corrections. Two practical ways of meeting these requirements follow.

The first way involves the recognition that large errors in B can product high magnitudes of $\epsilon(n)$. Large errors are detected by comparing $|\epsilon(n)|$ with a recent peak of $|y(n)|$ (or any other reliable measure of input signal level). For "large" errors we can allow large corrections to rapidly get into the vicinity of the correct B. Then, when $|\epsilon(n)|$ is small, the final convergence can continue with a fixed "small" magnitude correction. This procedure can be implemented using several comparators to generate a map of corrections to B as shown in FIG. 1. This algorithm effectively quantizes the previous convergence algorithm (with variable $\alpha$) and leads to a B correction where, for the $n^{th}$ sample the direction is determined as indicated by Eq. 8, i.e., $$\text{Sign}(C_B) = \text{Sign}\left[\epsilon(n)\frac{\delta y}{\delta B}(n)\right], \quad (13)$$

and the correction magnitudes, $\alpha(\epsilon/A)$, are defined by the quantized relative error magnitudes.

A second way of avoiding the deficiency of a single fixed magnitude correction involves enlisting the aid of an external control. For example, when "significant" incoming energy is detected, the convergence proceeds with a fixed large magnitude to rapidly get into the vicinity of the correct B. In succeeding time intervals, "smaller" fixed magnitudes are used. This process continues until the desired accuracy is reached. In this case, the correction magnitude is only a function of time, $\alpha(n)$. With this algorithm B will always appear to "converge", so a separate measure, such as a comparison of signal to error, must be used to verify that the input was a single frequency. Either of the simple algorithms or a combination of them are suitable for implementation particularly in a programmable digital signal processor.

All the convergence algorithms determine the direction for a correction in the same manner, i.e., Equation (13). Note that this sign is dependent on the sign of the error signal and the sign of a delayed version of the input signal. For sources having a good signal to noise ratio, the sign of the input samples is rarely affected by noise. When ERROR(B) is large, the error signal is also large and its sign is dominated by the correlated component. In this case, relatively large corrections can be made confidently to B. Unfortunately as B approaches the correct value, the correlated component of the error signal will become smaller than the noise component.

Then, the sign of the error signal becomes very unreliable for determining the sign of the correction to B.

In this case corrections must be averaged over many samples. This is equivalent to requiring that $\alpha$ be very small to obtain the required accuracy. If it is considered that the error signal is being produced by an adaptive filter, these generalities can be quantified.

Figure 2:
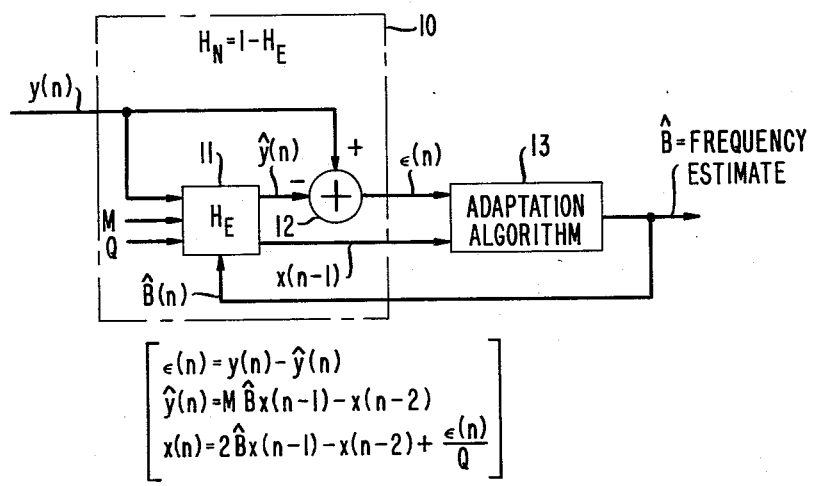
FIG. 2 is a basic illustration of an embodiment of the invention.

FIG. 2 illustrates a general form of the adaptive filter comprising a notch filter with an appropriate adaptation algorithm. Overall notch filter 10 has a transfer function, $H_N$, and includes estimation filter 11 with a transfer function, $H_E$, and means to produce an output error signal, $\epsilon$, the difference between the estimate and the incoming sample. The estimate is defined by $$y(n) = mBx(n-1) - x(n-2), \quad (14)$$

with a constant of m having a value anywhere between one and two where internal to filter 11 a combination of past derived values (x)n is used to form y(n) with $$x(n) = 2Bx(n-1) - x(n-2) + \frac{\epsilon(n)}{Q} \quad (14a)$$

with another constant $Q \geq 1$ related to the selectivity of the filter and the error signal is $$\epsilon(n) = y(n) - y(n). \quad (14b)$$

The adaptation algorithm is used to form the frequency estimate B in box 13. The correction to the estimate may be considered as two items, direction and magnitude. The direction or sign of the correction may be obtained by exclusively ORing the sign of $x(n-1)$ and the sign of the error signal. The magnitude may be selected from a short list of preselected fixed values with the larger values used initialy in adaptation and smaller values used later to obtain an accurate convergence.

With this definition for y, the output error signal available from the output of subtractor 12 becomes $$\epsilon(n) = -2Q \text{ERROR}(B) x(n-1), \quad (15)$$

where Q is a measure of the sharpness of the notch relative to the minimum order filter. The estimation filter also can provide $x(n-1)$, a signal in phase with the partial of y with respect to B as required by the convergence algorithm. The estimation filter requires a single input variable, B, to define the frequency component being estimated. The value of the notch frequency variable, $\omega_0$, is defined by $B = \cos(\omega_0 T)$. There is thus one multiplication required for each input sample. All the filters to be described may then be thought of as having this form. The adaptation algorithm is driven by the notch filter output signal, $\epsilon$, and $x(n-1)$.

Figure 3:
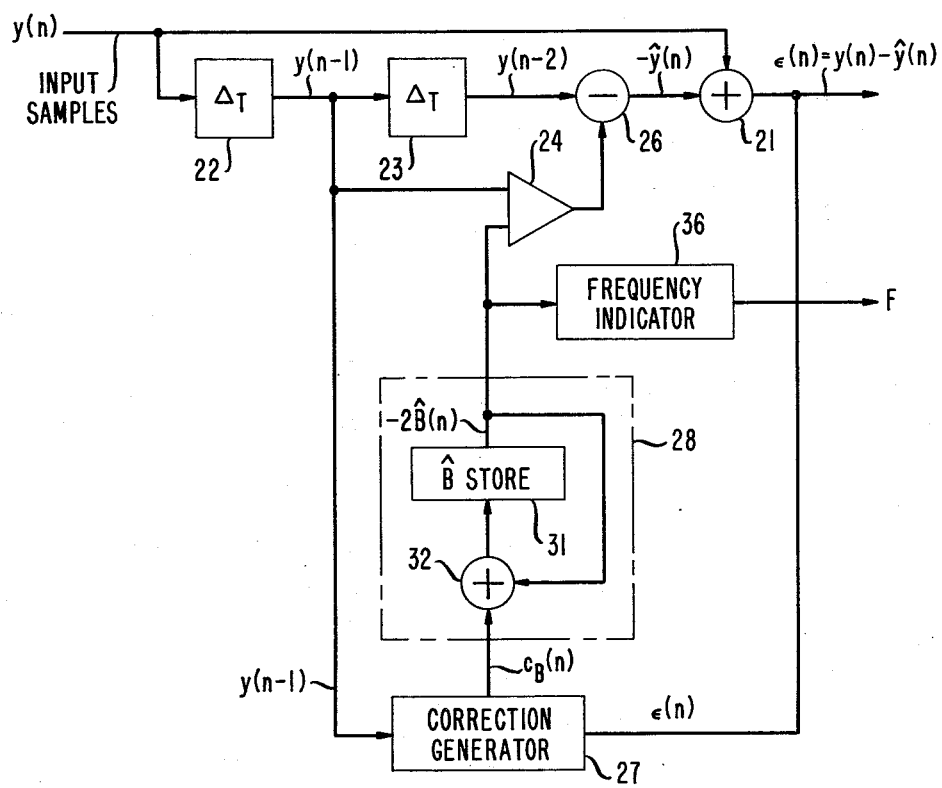
FIG. 3 is a feedforward or FIR illustrative embodiment of the inventive principles.

FIG. 3 is a basic feedforward implementation of the principles of the invention. The input signal y(n) is applied to signal adder 21 and a 2-tap delay line formed by delays 22 and 23. When the current value of the input signal, typically in the digital form of code groups, occurs at adder 21, the output of delay 22 provides the immediate previous code group $y(n-1)$ while delay 23 provides the code group $y(n-2)$ immediately previous to that of delay 22. Associated with delays 22 and 23 is multiplier 24 which weights the output of delay 22 in accordance with a variable parameter to produce an input for adder 26.

The components of FIG. 3 described in the foregoing paragraph form an adaptive filter which, when appropriately controlled, serves to attenuate a frequency component of significant signal energy in the input signal. This forms the simple notch filter whose transfer function is $H_F = 1 - H_E = 1 - \{BZ^{-1} - Z^{-2}\}$. In performing this function adder 26 provides an estimate of the current code group based upon a weighted combination of the two previous code groups. Adder 21 combines the predicted code group with the actual code group to provide an error signal $\epsilon(n)$ which is the difference or the error in the prediction.

The error signal and the output of delay 22 are the inputs to correction generator 27 which serves in providing a variable parameter. This parameter has a prescribed relationship to the frequency of the signal component. In the process of adaption, the arrangement of FIG. 3 automatically functions to decrease the error signal by providing maximum attenuation.

The output of generator 27 is applied to accumulator 28 formed by interconnected store 31 and adder 32. The output of store 31 provides the variable parameter for multiplier 24. While adapting, the output of adder 21 provides an indication of the accuracy of the prediction of the current sample while the output of delay 22 provides an "inphase" signal indicative of the direction, i.e., its sign, of the correction of the variable parameter. Generator 27, whose output is designated $C_B(n)$, may be determined, for example, by the fractional relationship of $$\frac{\epsilon(n)}{2y(n-1)}$$

as long as the denominator is not zero. Through successive corrections this arrangement will reduce $\epsilon(n)$ to essentially zero until the input signal changes in frequency level of phase.

At this time, frequency indicator 36 provides an output value B accurately representative of frequency. Indicator 36 may take the form of a look-up table or read-only-memory programmed to provide $\omega$ where $$\omega = \frac{\cos^{-1}(B)}{T}.$$

or f where $$f = \frac{1 \cos^{-1}(B)}{2\pi T}.$$

Figure 4:
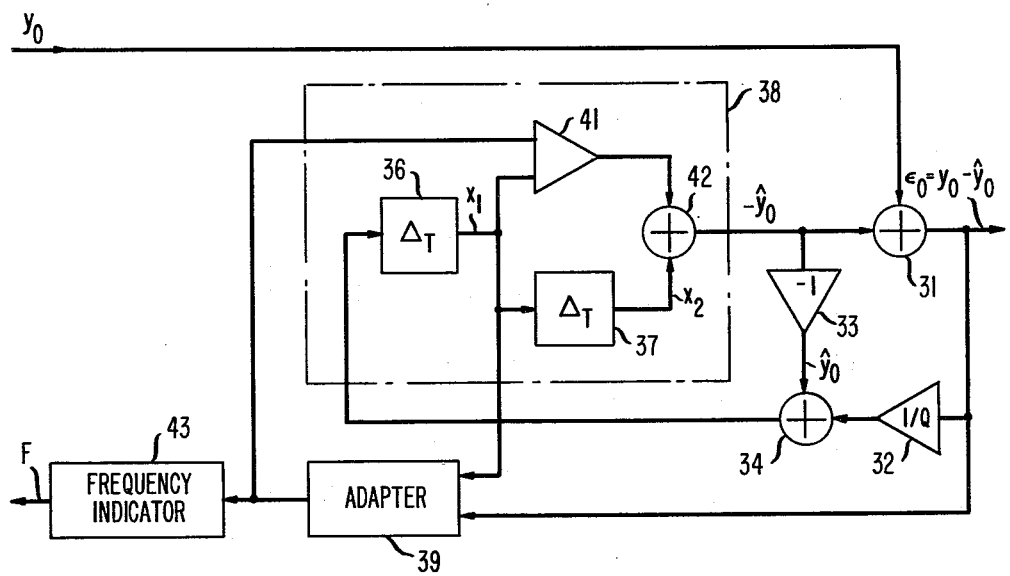
FIG. 4 is a recursive or IIR illustrative embodiment of the invention.

FIG. 4 is a recursive arrangement which utilizes the inventive technique. In the input portion arrangement, the input signal is initially compared to its predicted, or estimated value, by adder 31. However, in this case, the estimate is based upon derived values produced from two previous code groups of the input signal. The error now is weighted by a factor of 1/Q in scaler 32. The output of scaler 32 is combined with a signal of magnitude equal to the prediction but opposite in sign which is provided by multiplier 33 to adder 34. Adder 34 produces an output that is applied to 2-tap delay line comprising delays 36 and 37 in filter 38. The other input to filter 38 is generated by adapter 39.

Adapter 39 generates a variable parameter by using the outputs of adder 31 and delay 36. This variable parameter weights the derived value from delay 36 so that adder 42 yields the predicted value. When the arrangement of FIG. 4 is converged, the output of adapter 39 applied to frequency indicator 43 generates a variable value accurately related to the frequency of significant energy in the input signal. Due to the memory of filter 38 provided by the feedback signal component and the output of adapter 34 this arrangement may be typed as a second order recursive adaptive filter.

The performance characteristic of the arrangement of FIG. 4 is affected by the value of Q in scaler 32. For example, speed of convergence is high for low values of Q, e.g., $Q \leq 2$, while high values of Q, e.g., $Q \geq 6$, provide precision for the frequency output of indicator 43. Both performance characteristics are appropriately desirable and may be provided by using a low value of Q for an initial response until it is determined that a tone or frequency component is present and then switched to a relatively high value of Q for a more precise determination of the frequency. When these values of Q are integer powers of 2, e.g., Q=8 and Q=2 then scaler 32 may be readily implemented by a select gate or a binary shift. Thus, the arrangement of FIG. 4 in actual implementation represents a modest increase in complexity over the implementation of the arrangement of FIG. 3. This is more than outweighted by a higher degree of noise immunity for practical applications.

Figure 5:
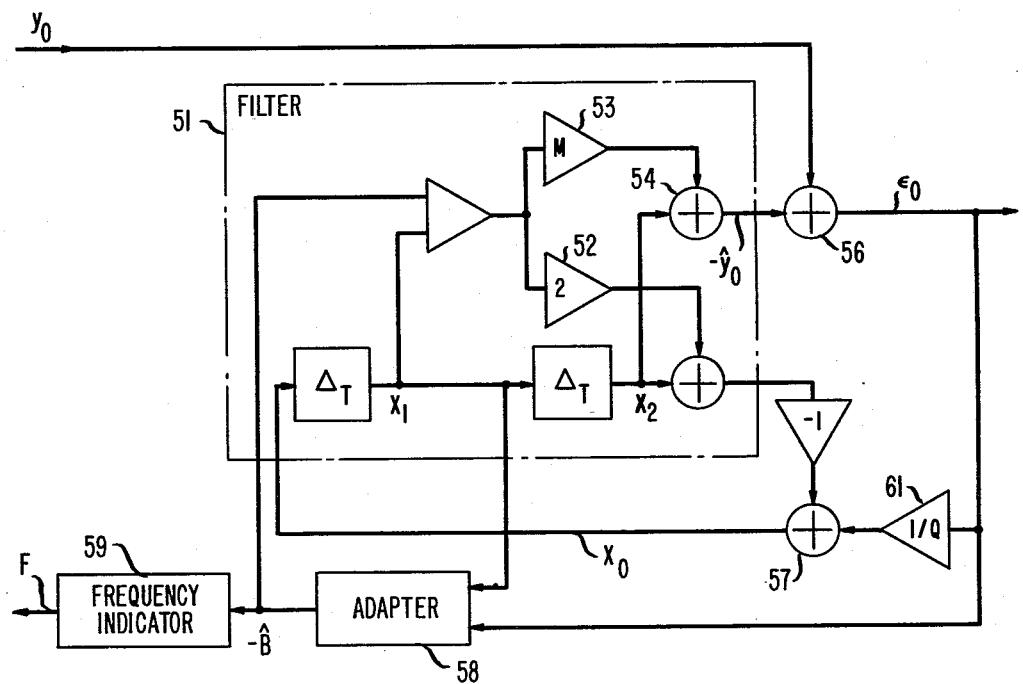
FIG. 5 is a particularly flexible illustrative embodiment of the invention.

FIG. 5 is a generalized form of circuit which is capable of representing the circuitry of either FIG. 3 or FIG. 4. The analytical basis of this circuit may be represented by various analytical relationships which follow.

$$\epsilon_0 = y_0 - y_0 = \frac{y_0 Q H_F}{QH_F + MBz^{-1} - z^{-2}}; Q \geq 1, \quad (16)$$

$$y_0 = MBx_1 - x_2 = x_0(MBz^{-1} - z^{-2}); 2 \geq M \geq 1, \quad (17)$$

$$x_0 = \frac{\epsilon_0}{Q} + 2Bx_1 - x_2 = \frac{\epsilon_0}{Q(1 - 2Bz^{-1} + z^{-2})} = \frac{\epsilon_0}{QH_F}, \quad (18)$$

It should be understood that $x_0$ is defined as $x(n)$ with $x_1 = x(n-1)$, etc., and $z^{-1}$ and $z^{-2}$ are the intervals of the delays used respectively to provide $x_1$ and $x_2$ in FIG. 5.

Since the actual circuitry of FIG. 5 is substantially similar to the circuit of FIG. 4, the main attention will focus on the differences. In FIG. 5, filter 51 additionally includes multipliers 52 and 53, and adder 54. The additional components allow filter 51 to provide different, but related, signals to each of adders 56 and 57. As is the case for the previous circuit, the signal for adder 56 is a prediction or estimate of the current signal from adapter 58 based upon signal history (past signal values). The other output of filter 51 is the related signal which is applied to adder 57 serving to weight the past history. In particular, the duration and the relative weighting in time of the history is fed back into the filter to provide the overall circuit with a measure of noise immunity. When the circuit converges, the output of frequency indicator 59 represents the frequency of the signal component in the input signal.

The appropriate choice of values for M and Q vary the operational characteristics of the circuit such that a family of estimation filters is represented. M and Q respectively are the factor of multiplier 53 and the reciprocal of the factor of multiplier 61. The following table lists the various types of filter responses via the circuit of FIG. 5 obtained using specific values or ranges of values for M and Q. M and Q are not restricted to integer values since optimum performance in a specific application may require M and Q to have other values, such as intermediate values. However, in some specific implementation, powers of two values are less expensive to implement and sufficient.

TABLE I

Figure 7:
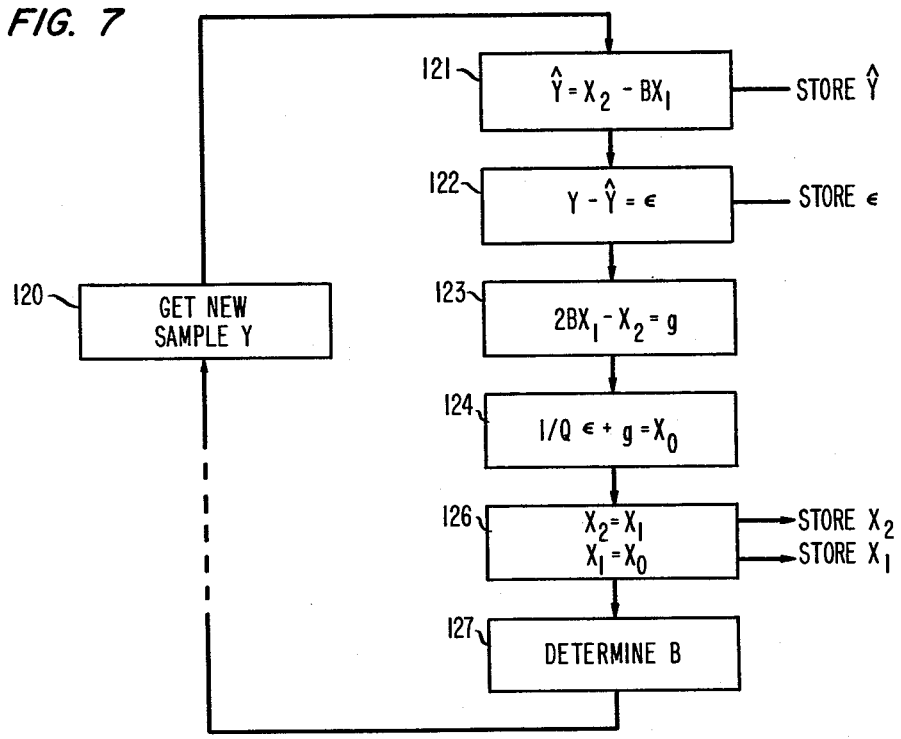
FIG. 7 is a flow chart of the basic adaptive filter technique.
Figure 8:
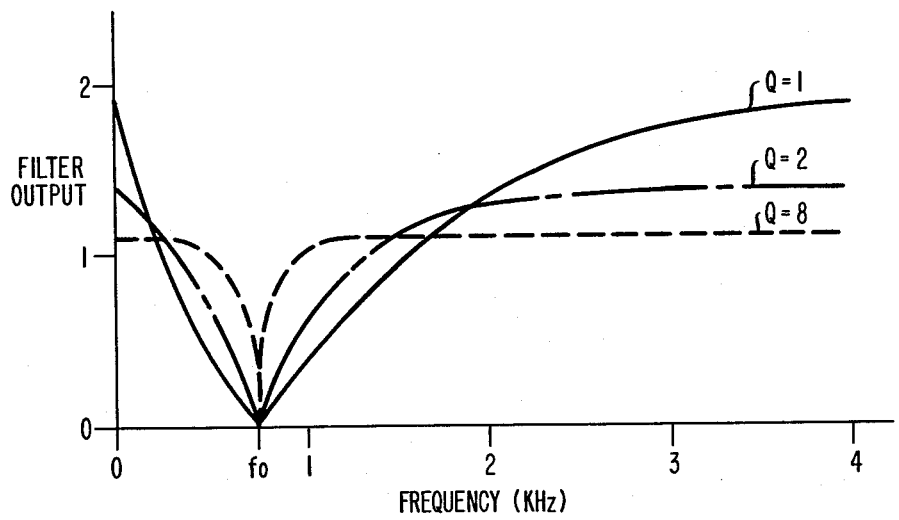
FIG. 8 is a family of filter characteristics obtainable using the described adaptive filter techniques.

|  | Class | M | Q |
|---|---|---|---|
| FIG. 3 | FIR | 2 | 1 |
| FIG. 4 | IIR | 2 | $>1$ |
| FIGS. 7 & 8 | IIR | 1 | $\geq 1$ |

It should be understood that in addition to the variability provided by different filtering arrangements, there are also various approaches that may be taken in convergence algorithms, not to mention a wide range of possible implementations. Furthermore, the choice made in one of these areas such as the filter does not limit the choice used in the selection of convergence algorithm. Of course in practical applications, certain specific arrangements or combinations will be better suited and provide superior performance than available from other combinations.

Figure 6:
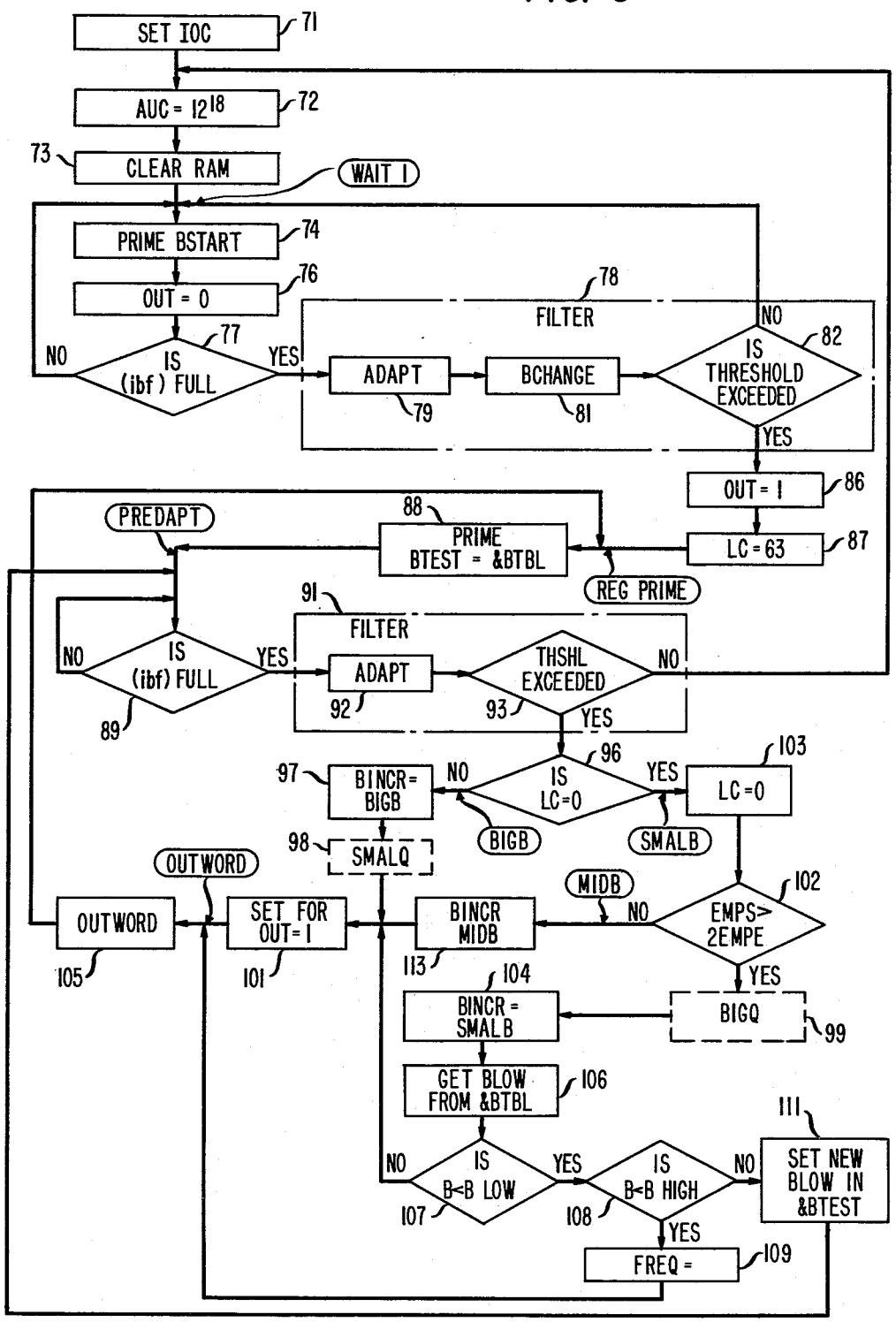
FIG. 6 is a flow chart of an overall procedure using the described adaptive technique.

FIG. 6 is a flow chart of an overall adaptive filter procedure suitable for implementation on a general purpose computer capable of doing digital signal processing. Digital signal processing microprocessors may be programmed to perform this procedure. The compact integrated form of these devices is very desirable, but such a device should be capable of providing sufficient signal processing between successive signal values to completely define the next predicted value. Three different symbols are utilized: oval symbols denote program labels and are used as descriptive entry points into the program; rectangular symbols, commonly referred to as operational blocks, require the performance of a particular operational step which may involve a number of subsidiary steps; and diamond shaped symbols, commonly referred to as either conditional branch points or decision blocks, require a test to be performed to determine the course of the following operation.

At the start of the flow chart, registers in the programmed machine designated IOC and AUC for input output control and arithmetic unit control are respectively set for the expected input and output data formats and the type of rounding or truncation to be used in performing the adaption. Blocks 71 and 72 provide these operations. In block 73 all RAM locations are called to be cleared so that the read/write memory is available as a scratch pad. Prime Bstart is called for in bock 74 to determine the adaption starting frequency in accordance with the range of expected input frequencies. In block 76, the output register is set to zero to indicate that the threshold level has not been exceeded.

At conditional branch point 77 the input register is examined to check for the arrival of a code word representing a new sample. If not, the program returns to WAIT1 to provide a refresh of the Prime Bstart in the RAM. (The type of RAM used required this refresh which may not be necessary in other implementations.) The looping back will continue until the test in conditional branch point 77 is met indicating that a new sample has arrived.

The block labeled filter 78 calls for an unconditional adaption and as a result changes the value of B. These two operations occur respectively in internal blocks 79 and 81 which are described in conection with FIG. 7. The next step is conditional branch point 82 in filter 78 which determines if the exponentially mapped past value of the input signal (EMPS) has exceeded a threshold. This test equivalent to an analog a level check of the full wave rectified value of the input signal stored in a resistive-capacitive integrator. A typical threshold value for telecommunications applications may be on the order of −40 dBmO. Once this threshold is exceeded, it indicates that a true input signal is considered present so the procedure may be advanced to provide meaningful adaption. In addition it allows the filter transient to commence as adaption is held to the starting value.

At block 86 the output register has its least significant bit set to one to indicate that a meaningful input signal has been recognized. In block 87, a loop counter is set to 63 before proceeding to block 88. This is used such that the adaption process will take place unconditionally for 64 successive input values. The duration of unconditional adaption in terms of input values is an engineering choice that may be readily changed to suit each application. In block 88, PRIME BTEST is set to &Btable (&BTBL). This provides an address for a location of a test value of B to be used later in the program. The procedure is now at a point where a location in ROM is pointed to by a value in RAM for access at a later step in the procedure.

The current value of the input signal, provided it has arrived, is available in the input buffer (ibf) called for by conditional branch point 89. If not, the program continuously cycles through PREDAPT until it has arrived. Once a signal is present the adaptive filter routine is called in filter 91 which again in block 92 utilizes the subroutine of FIG. 7. At the end of the adaption cycle, conditional branch point 93 tests the threshold of the EMPS signal which may typically have a decay time constant of 4 ms. This also provides a bridging capability should the signal disappear for a short period of time before returning. The entire process is thus prevented from restarting upon the occurrence of a short dropout. If the dropout is not short so that the threshold is not met, then branch point 93 recycles the program back to operational block 72. The entire process can be restarted when the signal does reappear.

Each time filter 91 is utilized the loop counter of block 87 is reduced by one. Upon exiting filter 91 the status of the loop count is checked for zero value at conditional branch point 96. If not, the next step is block 97 wherein B is incremented by a large amount in the interest of fast adaption. For the moment blocks 98 and 99 should be ignored since their relevance will be discussed hereinafter. Accordingly, block 101 is next. The output value of one is maintained in block 101 to indicate that an input signal is considered present.

Returning to branch 99, once the loop counter equals zero the procedure moves on to block 103 where a register for the value of the loop count is set to zero before advancing to conditional branch point 102. It should be understood that as conditional branch point 96 is exited, the loop counter is decremented so block 103 is required to be reset to zero to eliminate the occurrence of a minus one. The test of branch point 102 determines the ratio of the integrated value of the full wave rectified input signal to that of the integrated value of the full wave rectified error signal. The value of two or greater provides a signal-to-noise or error ratio of at least 6 dB. However, this is merely an engineering choice which may be readily changed with due consideration to the adaption performance for a specific application.

In this particular procedure, the values of BIGB, MIDB, and SMALLB respectively are 0.00821, 0.00410, and 0.00041. These values produce the largest frequency change at 700 Hz. Frequency changes of 20 Hz correspond to each BIGB change, 10 Hz for each MIDB change, and finally 1 Hz for each change in SMALLB. These are the frequency changes at 700 Hz.

If this test is not satisfied then further correction is required of B for convergence and the procedure advances to block 113 wherein middle B (MIDB) is used to provide moderate steps in the adjustment of the value of B when the flow loops back to REGPRIME which will again utilize the operations of filter 91. The flow during loop back passes through operational block 105 which calls for an output word to indicate that B is not suitable to obtain frequency information. This process of adjusting MIDB will continue until the test of conditional branch point 102 is satisfied indicating successful adaption, at which point block 104 is next. Block 104 calls for B to be changed in fine steps. Then the flow proceeds to block 106 calling for the value of BLOW to be obtained from &TABLE.

At conditional branch point 107, the value of the incremented B from filter 91 is compared to BLOW. If this test is not satisfied it indicates that the actual frequency is below the lower tolerance of the frequency tested and the sequence proceeds to block 101 to indicate that a suitable test result is not to be indicated. If the test of branch point 107 is positive, then branch point 108 is next. At branch point 108, the value of B is checked or compared to BHIGH which is also obtained from &TABLE which is an address an increment of one away from BLOW. If this condition is satisfied, it indicates that the value of B is between the upper and the lower frequency limits and, hence, the frequency is within tolerance. Accordingly, block 109 may now indicate an output for that particular frequency value. This output for frequency, or test result, actually is called to be indicated for the first time by block 105. If this test is not satisfied, it indicates that the frequency actually adapted is not within an acceptable frequency range. Then block 111 points to the next higher frequency range in &BTBL as the process then recycles back to PREADAPT for further adjustment of the value of B using the next input value.

Operational block 111 functions as a moving pointer for successive frequency ranges in ascending value corresponding to ascending address locations in the &BTBL. Each time the procedure is directed to block 111, the value of B is not within the limits of the range bounded by BLOW and BHIGH and the next higher frequency range is used when the tests of conditional branch points 107 and 108 are subsequently applied. After the highest frequency range is checked and it nor any of the previous tests are satisfied, a value of BTEST greater than any possible value for B is used to recycle the sequence back to point 89. Then as the sequence subsequently enters point 107, it loops back to REGPRIME reinitializing the table process. Accordingly, another attempt will be made to compare the converged value of B to one of the acceptable frequency ranges. Also when converged B is in an acceptable frequency range, the sequence recycles back to block 88 to repeat the measurement process starting with BLOW for the lowest frequency range. This same loop back is used when converged B is not less than BLOW via blocks 101 and 102 which serve to indicate a frequency of convergence less than the lower limit of the lowest frequency range.

Attention is now directed back to blocks 98 and 99 shown in dashed outline. Although this procedure does provide a priori starting point for adaption, Prime Bstart, and three ranges for dynamic adjustment of B, it does not dynamically adjust Q. However, the locations of blocks 98 and 99 provide logical points for respectively providing low and high values of Q. During unconditional convergence (BIGB), the Q in block 98 would be desirably set low to provide fast convergence. As the value of B is close to converging, Q may be increased to sharpen the frequency response of the filter to provide an attendant improvement in the signal to error ratio for more precise convergence.

FIG. 7 is a diagram of the basic adaptive filter subroutine called at two points in FIG. 6. In block 120 a new sample of the input signal is obtained from ibf. Next in block 121 the estimate of the new sample is generated using $x_1$ and $x_2$, which are previously derived values from the two preceding samples, and B the frequency related variable. The value of B is usually the result of a previous iteration of this subroutine. The estimated value is stored in a RAM. Then, block 122 calls for determining the error $\epsilon$ of the estimate by subtracting it from the new, or current, sample. The value of the error is also stored.

In operational block 123, the value of g, a temporary value, is calculated using the same quantities as that of block 121. Block 124 serves to form $x_0$ using the error $\epsilon$ divided by Q added to the value of g. The new values of $x_1$ and $x_2$ are obtained in block 126 by respectively using the previous values of $x_1$ and $x_0$. These new values are stored to be used in the next cycle through the subroutine of FIG. 7. Then in block 127 the previous value of B is corrected for use in determining the next estimate for the next successive value of the input signal which is obtained in accordance with block 120 when the process repeats itself as required according to FIG. 6.

FIG. 8 illustrates a typical filter frequency response characteristic. The filter output is normalized to represent the gain of the overall arrangement. Three response characteristics are shown for three different values of Q. In each case, the filter in this example is converged to a frequency of $f_0 = 700$ Hz. The filters exhibit a notch characteristic centered at frequency $f_0$ and provide maximum attenuation at this frequency. A 4 kHz range is shown since voiceband encoded signals are typically sampled at an 8 KHz rate. The only real constraint on frequency range is that the processing should be completed before the arrival of the next signal value to generate the best available prediction. Of course, significantly higher processing speeds are available using special purpose hardware with an attendant cost penalty.

Figure 9:
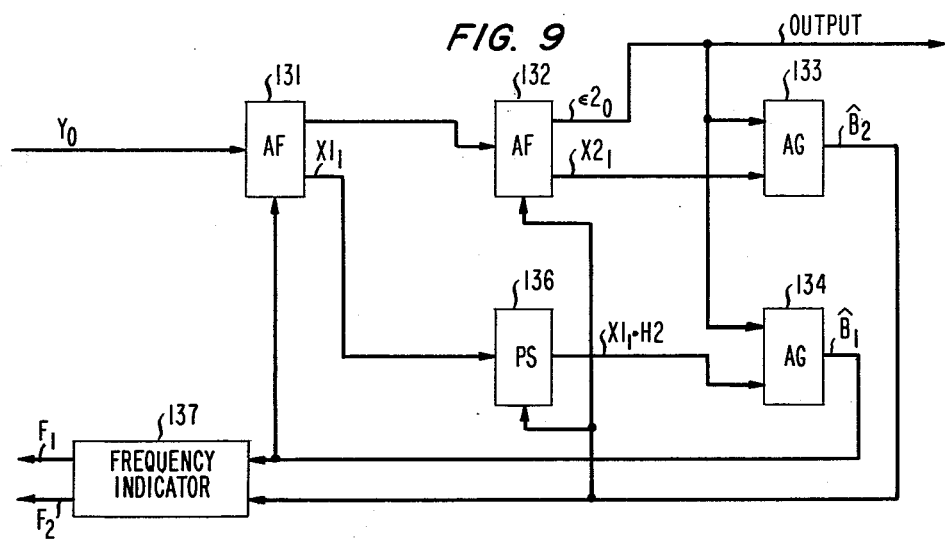
FIG. 9 illustrates an application of the inventive technique to dual frequency filtering.

FIG. 9 depicts an arrangement for utilizing the inventive principles for adaptively filtering multiple frequencies in a signal. This arrangement provides concurrent multiple frequency convergence. The input signal is applied to adaptive filter 131 which will serve to attenuate one frequency signal component to suppress it while passing on the remaining frequency signal component.

The output of filter 131 is applied as the input of adaptive filter 132 which will be left with the after frequency of the two frequencies at the input of filter 131. Filter 132 operates in the same manner as described for the single frequency adaptive filters. Accordingly, the error signal and the inphase signal are applied to adaptive generator 133 which provides the variable $B_2$ related to the input frequency of the component applied to filter 132. The inphase signal from filter 131 and the error signal from filter 132 are applied to adaptive generator 134. However, in this case, the inphase signal is adjusted in phase by phase shifter 136 to produce an inphase signal having the appropriate phase relationship with the error signal from filter 132. Thus, generator 134 may now use its two inputs to produce the adaptive variable related to the remaining frequency and the input signal. It should be pointed out that phase shifter 136 has the same internal circuitry as filter 132 so that its phase shift may be adaptively varied as directed by the variable $B_2$. When the adaption process is complete, filter 132 attenuates one frequency component of the input signal while filter 131 attenuates the other frequency of the input signal. Then, frequency indicator 137 provides an output representative of the two frequencies of convergence of filter 131 and 132. As apparent in FIG. 9, the filtered output signal $\epsilon 2_0$ is also available.

Figure 10:
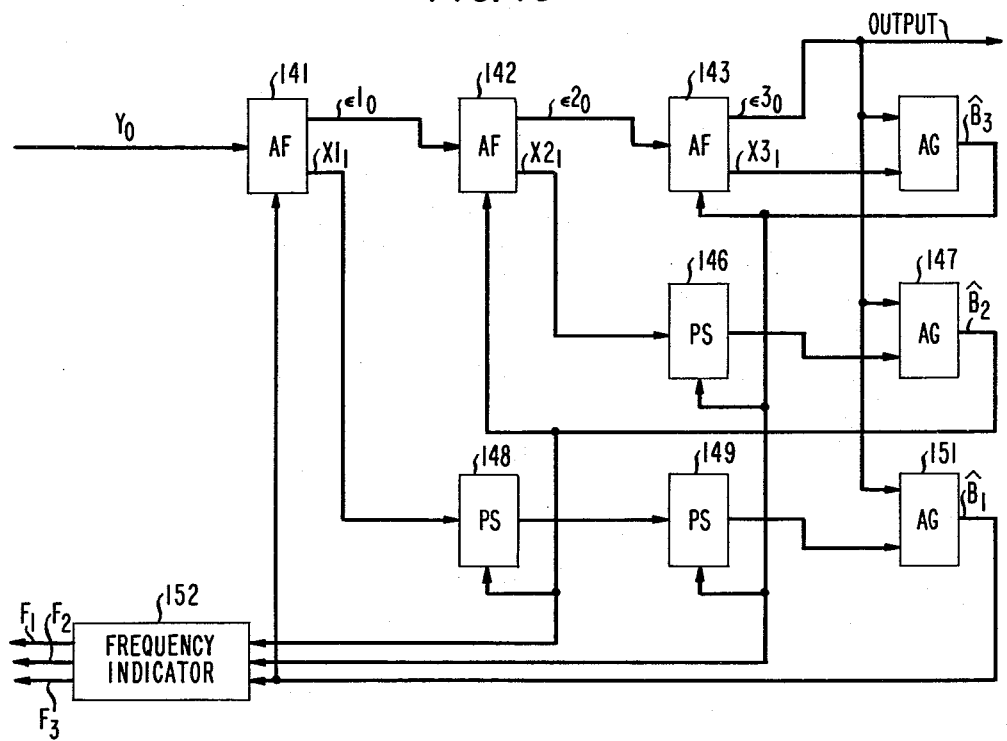
FIG. 10 illustrates an application for adaptively filtering three different frequencies.

FIG. 10 extends the inventive concept for simultaneously filtering three frequencies. In this arrangement, adaptive filters 141, 142, and 143, respectively, filter frequencies F1, F2 and F3. Filter 143 adapts to the frequency component which is left remaining after the input signal passes through filters 141 and 142. The operation of filter 143 and adaptive generator 144 is similar to filter 132 and generator 133 in FIG. 9.

The error signal from filter 143 is used in the adaption process by all three adaptive generators 144, 147, and 151. The inphase signal from filter 142 is phase adjusted by phase shifter 146 before application to adaptive generator 147 which not only adjusts filter 142 but also phase shifter 148. The inphase signal from filter 141 is phase adjusted twice, first by phase shifter 148 and then by phase shifter 149. Each phase shifter has the same type of internal circuitry as the adaptive filter driven by the same variable value from the respective one of the adaptive generators. This enables the inphase signal to have the appropriate phase relationship with the error signal from filter 143 for application to adaptive generator 151 to adjust filter 141. Frequency indicator 152 uses the three variable values to provide an output representative of the three frequency components of the input signal.

Accordingly, in this arrangement, each of filters 142 and 143 are adapted to an input signal which respectively has one or both of the remaining interfering frequencies attenuated by the other filters in the cascade arrangement. Particularly, in the case of the control signal situations, this arrangement allows each filter to operate as though the other frequencies and filters are not present. In addition to the frequency outputs the filtered output $\epsilon 3_0$ is available in the arrangement of FIG. 10.

Although the illustrative arrangements have been described using signal components of arbitrary frequency but presumed to be of constant value, the invention has the ability to track changing frequency values and may be readily so employed for appropriate applications such as used in data transmission. Furthermore, the adaptive method and embodiments may be readily used to measure amplitude and phase of sinusoidal frequencies. Moreover, the approaches used represent a practical balance in the tradeoff between speed and accuracy of adaption. In all cases it is to be understood that the foregoing arrangements are merely illustrative of the principles of the invention and that numerous and varied other arrangements may be devised by those skilled in the art without departing from the spirit and scope of the invention.

What is claimed is:

1. A method of tuning an adaptive variable to the frequency of a signal component in an input signal including the steps of
   a. forming a predicted value of the input signal using derived signal quantities of past input signal values wherein at least one derived signal quantity is weighted in accordance with an adaptive variable,
   b. comparing the present value of the input signal to the predicted value to generate an error signal,
   c. using at least one of the derived signal quantities and said error signal to produce a correlation between the predicted value and the signal component of said input signal, and tuning said adaptive variable by changing said adaptive variable incrementally based on said correlation in a manner to have a prescribed relationship to the frequency of the signal component in said input signal and to reduce the magnitude of said error signal, and
   d. checking the magnitude of the input signal and allowing the preceding steps to be repeated when the magnitude of the input signal exceeds a prescribed threshold.

2. The method of claim 1 further including the steps of
   e. counting the number of times the adaptive variable of step (c) is incremented,
   f. comparing the magnitude of the input signal to the error signal for a prescribed magnitude relationship and using first size changes in the adaptive variable smaller than the increments of step (c) when the prescribed relationship is not satisfied and using still smaller changes in the adaptive variable compared to the first size changes when the prescribed relationship is satisfied.

3. The method of claim 2 further including the steps of
   g. testing the adaptive variable after step (f) by comparing it with a first prescribed value and returning the method to step (a) when the value of the adaptive variable is less than the first prescribed value and proceeding to step (h) when the value of the adaptive variable is greater than the first prescribed value,
   h. testing the adaptive variable by comparing it with a second prescribed value for outputting an indication of frequency of a particular frequency range when the adaptive variable is less than the second prescribed value and returning to step (a) when the adaptive variable is greater than the first prescribed value while also changing the first prescribed value and the second prescribed value to define a different frequency range.

* * * * *